(12) United States Patent
Breitling et al.

(10) Patent No.: US 10,029,911 B2
(45) Date of Patent: Jul. 24, 2018

(54) MICROMECHANICAL COMPONENT INCLUDING A DIFFUSION STOP CHANNEL

(71) Applicant: Robert Bosch GmbH, Stuttgart (DE)

(72) Inventors: Achim Breitling, Reutlingen (DE); Frank Reichenbach, Wannweil (DE); Jochen Reinmuth, Reutlingen (DE); Julia Amthor, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 15/401,808

(22) Filed: Jan. 9, 2017

(65) Prior Publication Data
US 2017/0203957 A1    Jul. 20, 2017

(30) Foreign Application Priority Data

Jan. 16, 2016  (DE) .......................... 10 2016 200499

(51) Int. Cl.
*B81B 7/00* (2006.01)
*B81C 1/00* (2006.01)

(52) U.S. Cl.
CPC ........ *B81B 7/0041* (2013.01); *B81C 1/00293* (2013.01); *B81B 2201/0235* (2013.01); *B81B 2203/0315* (2013.01); *B81B 2207/056* (2013.01); *B81B 2207/09* (2013.01); *B81C 2203/0109* (2013.01); *B81C 2203/019* (2013.01); *B81C 2203/0145* (2013.01)

(58) Field of Classification Search
CPC ... B81B 7/0041; B81B 2207/056; B81B 7/02; B81C 1/00293; B81C 1/00269; B81C 1/00198; B81C 99/004; B81C 1/00182; G01P 15/0802; G01R 33/0286; G01C 19/5783
USPC .............................. 438/51; 216/2, 41, 56, 99
See application file for complete search history.

(56) References Cited

U.S. PATENT DOCUMENTS

| | | | |
|---|---|---|---|
| 2015/0111332 A1* | 4/2015 | Lee ..................... | B81C 1/00269 438/51 |
| 2015/0123217 A1* | 5/2015 | Reinmuth ................. | B81B 3/00 257/415 |

FOREIGN PATENT DOCUMENTS

| | | |
|---|---|---|
| DE | 19537814 A1 | 4/1997 |
| WO | 2015120939 A1 | 8/2015 |

* cited by examiner

*Primary Examiner* — Mouloucoulaye Inoussa
(74) *Attorney, Agent, or Firm* — Norton Rose Fulbright US LLP; Gerard Messina

(57) ABSTRACT

A method for manufacturing a micromechanical component is provided including a substrate and including a cap, which is connected to the substrate and, together with the substrate, encloses a first cavity, a first pressure prevailing and a first gas mixture having a first chemical composition being enclosed in the first cavity, the cap together with the substrate enclosing a second cavity, a second pressure prevailing and a second gas mixture having a second chemical composition being enclosed in the second cavity. A recess situated essentially between the first cavity and the second cavity is formed for diverting at least one first particle type of the first gas mixture and/or at least one second particle type of the second gas mixture.

4 Claims, 4 Drawing Sheets

MICROMECHANICAL COMPONENT INCLUDING A DIFFUSION STOP CHANNEL

CROSS REFERENCE

The present application claims the benefit under 35 U.S.C. § 119 of German Patent No. DE 102016200499.9 filed on Jan. 16, 2016, which is expressly incorporated herein by reference in its entirety.

BACKGROUND INFORMATION

A method is described in PCT Application No. WO 2015/120939 A1. When a certain internal pressure is desired in a cavity of a micromechanical component or a gas mixture having a certain chemical composition is to be enclosed in the cavity, the internal pressure or the chemical composition is frequently adjusted during capping of the micromechanical component or during the bonding process between a substrate wafer and a cap wafer. During capping, for example, a cap is connected to a substrate, whereby the cap and the substrate together enclose the cavity. By adjusting the atmosphere or the pressure and/or the chemical composition of the gas mixture present in the surroundings during capping, it is thus possible to adjust the certain internal pressure and/or the certain chemical composition in the cavity.

With the aid of the method described in WO 2015/120939 A1, an internal pressure may be adjusted in a targeted way in a cavity of a micromechanical component. It is in particular possible with the aid of this method to manufacture a micromechanical component having a first cavity, a first pressure and a first chemical composition being adjustable in the first cavity, which differ from a second pressure and a second chemical composition at the time of capping.

In the method for targeted adjusting of an internal pressure in a cavity of a micromechanical component according to WO 2015/120939 A1, a narrow access channel to the cavity is created in the cap or in the cap wafer, or in the substrate or in the sensor wafer. Subsequently, the cavity is flooded with the desired gas and the desired internal pressure via the access channel. Finally, the area around the access channel is locally heated with the aid of a laser, the substrate material liquefies locally and hermetically seals the access channel during solidification.

Another method for adjusting an internal pressure in a cavity of a micromechanical component is described in German Patent Application No. DE 195 37 814 A1. Such a method is provided for manufacturing rotation rate sensors and acceleration sensors. In this method, a plurality of free-standing thick polycrystalline functional structures are manufactured on a substrate, buried strip conductors and electrodes being situated below the functional layers. The micromechanical structures manufactured in this way are sealed with a cap wafer later in the process sequence. A suitable pressure, depending on the use, is enclosed within the sealed volume.

In the case of rotation rate sensors, for example, a very low pressure is enclosed, which is 1 mbar, for example. This is the case, since in rotation rate sensors a portion of the movable structures is resonantly driven. At low pressure, it is possible to very easily induce a vibration with relatively low voltages due to the low attenuation.

In the case of acceleration sensors, however, it is not desirable for the sensor to vibrate, which would be possible if an external acceleration were applied. Hence, these sensors are operated at a higher internal pressure. The internal pressure of an acceleration sensor is 500 mbar, for example.

SUMMARY

It is an object of the present invention to provide a method for manufacturing a micromechanical component, which is mechanically robust and has a long service life compared to the related art, in a simple and cost-effective manner compared to the related art. It is a further object of the present invention to provide a micromechanical component which is compact, mechanically robust and has a long service life compared to the related art. According to the present invention, this applies in particular to a micromechanical component including one (first) cavity. With the aid of the method according to the present invention and the micromechanical component according to the present invention, it is furthermore also possible to implement a micromechanical component in which a first pressure and a first chemical composition may be adjusted in the first cavity, and a second pressure and a second chemical composition may be adjusted in a second cavity. For example, such a method for manufacturing micromechanical components is provided, for which it is advantageous if a first pressure is enclosed in a first cavity and a second pressure is enclosed in a second cavity, the first pressure being different from the second pressure. This is the case, for example, when a first sensor unit for rotation rate measurement and a second sensor unit for acceleration measurement are to be integrated into a micromechanical component.

The object may be achieved in accordance with an example embodiment of the present invention by providing:
in a fourth method step, a recess, which is situated essentially between the first cavity and the second cavity, is formed for diverting at least one first particle type of the first gas mixture and/or at least one second particle type of the second gas mixture.

In this way, a method for manufacturing a micromechanical component is provided in a simple and cost-effective manner, with which a first diffusion of the first particle type from the first cavity in the direction of the second cavity and into the second cavity and/or a second diffusion of the second particle type from the second cavity in the direction of the first cavity and into the first cavity is disrupted with the aid of the recess. This advantageously makes it possible to reduce or prevent the presence of first particle types in the second cavity and/or the presence of second particle types in the first cavity compared to the related art. Thus, the likelihood of a limitation of the functionality or a failure of a first sensor unit situated in the first cavity due to particles of the second particle type and/or the likelihood of a limitation of the functionality or a failure of a second sensor unit situated in the second cavity due to particles of the first particle type is reducible compared to the related art. Thus, with the present invention, a method for manufacturing a micromechanical component is provided, which is mechanically robust and has a long service life compared to the related art, in a simple and cost-effective manner compared to the related art.

With the method according to the present invention, in particular, diffusion processes of light gases between a cavity having a high internal pressure to a cavity having a low internal pressure, for example, from the second cavity to the first cavity, are advantageously prevented or significantly reduced.

Moreover, the method according to the present invention may be advantageous if a gas such as, for example, molecular hydrogen (H2) or light inert gases such as, for example, helium (He) and neon (Ne) diffuse, for example, through oxide layers and other layers of micromechanical component 1 or of a MEMS element at temperatures occurring in the field such as, for example, 150° C. Such gases form, for example, during the capping process or bonding process due to a chemical reaction. However, such gases also diffuse, for example, due to high temperatures from the sensor wafer or the cap wafer occurring during the capping process. For example, in order to adjust a high internal pressure or a high second pressure in the cavity of the acceleration sensor or in the second cavity, gases such as, for example, molecular nitrogen (N2) are used, which do not diffuse or diffuse less well, for example, through oxide or the oxide layer. The additional gases, for example, which form during the capping process or which diffuse out of the substrate or out of the cap and are well able to diffuse through oxide or oxide layers, constitute only a small fraction as compared to N2. If the H2 diffuses over the lifetime, for example, out of the acceleration sensor cavity or out of the second cavity, the pressure in the acceleration sensor cavity or in the second cavity then changes very little. This is less problematic, for example, since acceleration sensors are also not susceptible to react to small pressure changes. It is more critical if, for example, a portion of the H2 is able to diffuse into the rotation rate sensor cavity or into the first cavity where, for example, failures of the rotation rate sensor result due to the low internal pressure and the high sensitivity of the rotation rate sensor to pressure change.

The method according to the present invention may also be advantageous if surfaces of sensors or sensor cores are provided with organic coatings, which prevent movable structures from sticking to one another, and these coatings degrade at the high temperatures, for example, during the bonding process and are no longer fully effective. An at least partial release of the organic layers into the cavity and, thus, increased internal pressure after sealing of the MEMS element or the micromechanical component may be counteracted with the method according to the present invention in a simple and cost-effective manner.

According to the present invention, a particle is preferably understood to mean an atom or a collection of atoms such as, for example, a molecule or multiple molecules. In connection with the present invention, the particle is located in a gaseous, liquid or solid aggregate state, or is part of a gaseous, liquid or solid phase and includes at least one phase interface in relation to its surroundings. According to the present invention, a particle is understood to mean, in particular, a body which, on the scale of the micromechanical component, is small, i.e., a body which has a maximum extension of 1/10 of a maximum extension of the micromechanical component.

According to the present invention, a particle type is understood to mean a particular type of a particle. For example, it is provided according to the present invention that the first particle type corresponds essentially to the second particle type. Alternatively, however, it is also provided, for example, that the first particle type differs from the second particle type. According to the present invention, it is provided, however, that the first particle type and the second particle type each differ with respect to a third particle type. According to the present invention, it is provided, for example, that the first particle type and/or the second particle type includes H2 and or a light inert gas such as, for example, He and Ne. For example, it is also provided that the third particle type includes N2.

According to the present invention, a recess situated essentially between the first cavity and the second cavity is understood to mean that the recess is situated in such a way that the recess includes at least partially a plane, the plane intersecting essentially perpendicularly a straight line, which connects the first cavity and the second cavity.

In connection with the present invention, the term "micromechanical component" is to be understood in that the term encompasses both micromechanical components and microelectromechanical components.

The present invention is preferably provided for a micromechanical component including its cavity or its manufacture. However, the present invention is also provided, for example, for a micromechanical component having two cavities, or having more than two, i.e., three, four, five, six or more than six, cavities.

The access opening is preferably sealed by introducing energy or heat with the aid of a laser into a part of the substrate or of the cap which absorbs this energy or this heat. Energy or heat is preferably introduced chronologically in succession into the respective absorbing part of the substrate or of the cap of multiple micromechanical components, which are manufactured together on a wafer, for example. However, alternatively, it is also possible to introduce the energy or heat simultaneously into the respective absorbing part of the substrate or of the cap of multiple micromechanical components, for example using multiple laser beams or laser devices.

Advantageous embodiments and refinements of the present invention may be derived from the description herein with reference to the figures.

According to one preferred refinement, it is provided that the recess is formed at least partially in a bond layer situated between the substrate and the cap. This advantageously makes it possible for the recess to be formed in a particularly simple and cost-effective manner during the bonding process. Moreover, it advantageously makes it possible for the first particle type and/or the second particle type, in particular, to be particularly simply and advantageously diverted into the surroundings during a diffusion through the bond layer.

According to one preferred refinement, it is provided that the recess is formed at least partially in a layer situated between the substrate and the cap. This advantageously makes it possible for the recess to be formed in a particularly simple and cost-effective manner during structuring of the layer. Moreover, it therefore advantageously makes it possible, in particular, for the first particle type and/or the second particle type to be particularly simply and advantageously diverted into the surroundings during a diffusion through the layer.

According to one preferred refinement, it is provided that the recess is formed at least partially in an additional layer situated between the substrate and the cap. This advantageously makes it possible for the recess to be formed in a particularly simple and cost-effective manner during structuring of the additional layer. Moreover, it therefore advantageously makes it possible, in particular, for the first particle type and/or the second particle type to be particularly simply and advantageously diverted into the surroundings during a diffusion through the additional layer.

According to one preferred refinement, it is provided that the recess is formed at least partially in the substrate and/or in the cap. This advantageously makes it possible for the recess to be formed in a particularly simple and cost-effective manner during structuring of the substrate and/or of the cap. Moreover, it therefore advantageously makes it possible, in particular, for the first particle type and/or the second particle type to be particularly simply and advantageously diverted into the surroundings during a diffusion through the substrate and/or the cap.

Additional subject matter of the present invention is a micromechanical component including a substrate and a cap which is connected to the substrate and, together with the substrate, encloses a first cavity, a first pressure prevailing and a first gas mixture having a first chemical composition being enclosed in the first cavity, the cap, together with the substrate, enclosing a second cavity, a second pressure prevailing and a second gas mixture having a second chemical composition being enclosed in the second cavity, the substrate or the cap including a sealed access opening, the micromechanical component including a recess situated between the first cavity and the second cavity for diverting at least one first particle type of the first gas mixture and/or at least one second particle type of the second gas mixture. In this way, a compact, mechanically robust and cost-effective micromechanical component having an adjusted first pressure and second pressure is advantageously provided. The above-mentioned advantages of the method according to the present invention apply correspondingly also to the micromechanical component according to the present invention.

According to one preferred refinement, it is provided that the recess is situated at least partially in a bond layer situated between the substrate and the cap. This advantageously makes it possible for the recess to be formed in a particularly simple and cost-effective manner during the bonding process. Moreover, it also advantageously makes it possible, in particular, for the first particle type and/or the second particle type to be particularly simply and advantageously diverted into the surroundings during a diffusion through the bond layer.

According to one preferred refinement, it is provided that the recess is formed at least partially in a layer situated between the substrate and the cap. This advantageously makes it possible for the recess to be formed in a particularly simple and cost-effective manner during the structuring of the layer. Moreover, it therefore advantageously makes it possible, in particular, for the first particle type and/or the second particle type to be particularly simply and advantageously diverted into the surroundings during a diffusion through the layer.

According to one preferred refinement, it is provided that the recess is formed at least partially in an additional layer situated between the substrate and the cap. This advantageously makes it possible for the recess to be formed in a particularly simple and cost-effective manner during the structuring of the additional layer. Moreover, it therefore advantageously makes it possible, in particular, for the first particle type and/or the second particle type to be particularly simply and advantageously diverted into the surroundings during a diffusion through the additional layer.

According to one preferred refinement, it is provided that the recess is formed at least partially in the substrate and/or in the cap. This advantageously makes it possible for the recess to be formed in a particularly simple and cost-effective manner during the structuring of the substrate and/or of the cap. Moreover, it therefore advantageously makes it possible, in particular, for the first particle type and/or the second particle type to be particularly simply and advantageously diverted into the surroundings during a diffusion through the substrate and/or the cap.

According to one preferred refinement, it is provided that the first pressure is lower than the second pressure, a first sensor unit for rotation rate measurement being situated in the first cavity, and a second sensor unit for acceleration measurement being situated in the second cavity. In this way, a mechanically robust micromechanical component for rotation rate measurement and acceleration measurement, having optimal operating conditions for both the first sensor unit and the second sensor unit, is advantageously provided.

DETAILED DESCRIPTION OF EXAMPLE EMBODIMENTS

Figure 1:
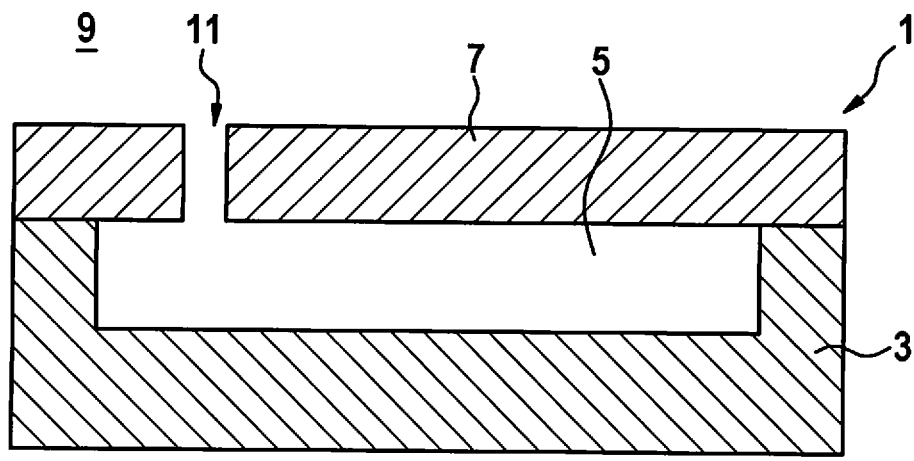
FIG. 1 shows a micromechanical component having an open access opening according to one exemplary specific embodiment of the present invention in a schematic representation.

Identical parts are denoted by the same reference numerals in the various figures and are therefore generally also cited or mentioned only once.

Figure 2:
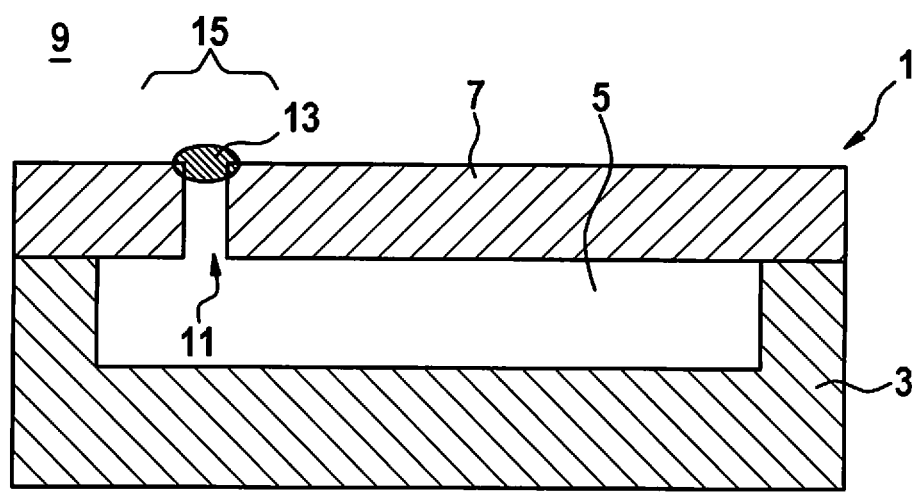
FIG. 2 shows the micromechanical component according to FIG. 1 having a sealed access opening in a schematic representation.

FIG. 1 and FIG. 2 show a schematic representation of a micromechanical component 1 having an open access opening 11 in FIG. 1, and having a sealed access opening 11 in FIG. 2, according to one exemplary specific embodiment of the present invention. Micromechanical component 1 includes a substrate 3 and a cap 7. Substrate 3 and cap 7 are, preferably hermetically, connected to one another and together enclose a first cavity 5. For example, micromechanical component 1 is designed in such a way that substrate 3 and cap 7 additionally together enclose a second cavity. The second cavity, however, is not shown in FIG. 1 and in FIG. 2.

For example, a first pressure prevails in first cavity 5, in particular when access opening 11 is sealed, as shown in FIG. 2.

Moreover, a first gas mixture having a first chemical composition is enclosed in first cavity 5. In addition, for example, a second pressure prevails in the second cavity, and a second gas mixture having a second chemical composition is enclosed in the second cavity. Access opening 11 is preferably situated in substrate 3 or in cap 7. In the present exemplary embodiment, access opening 11 is situated in cap 7 by way of example. According to the present invention, however, it may also be alternatively provided that access opening 11 is situated in substrate 3.

It is provided, for example, that the first pressure in first cavity 5 is lower than the second pressure in the second cavity. It is also provided, for example, that a first micromechanical sensor unit for rotation rate measurement, which is not shown in FIG. 1 and FIG. 2, is situated in first cavity 5, and a second micromechanical sensor unit for acceleration measurement, which is not shown in FIG. 1 and FIG. 2, is situated in the second cavity.

Figure 3:
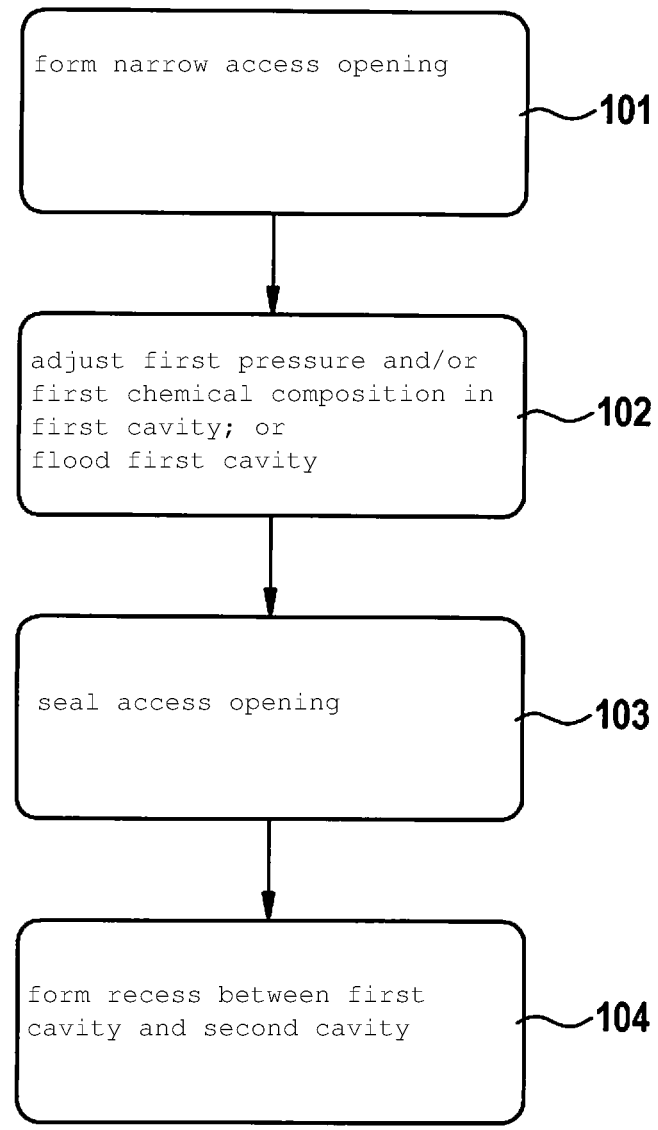
FIG. 3 shows a method for manufacturing a micromechanical component according to one exemplary specific embodiment of the present invention in a schematic representation.

FIG. 3 shows a method for manufacturing micromechanical component 1 according to one exemplary specific embodiment of the present invention in a schematic representation. In this method, in a first method step 101, in particular narrow access opening 11 connecting first cavity 5 to surroundings 9 of micromechanical component 1 is formed in substrate 3 or in cap 7. FIG. 1 shows micromechanical component 1 after first method step 101 by way of example. Moreover, in a second method step 102, the first pressure and/or the first chemical composition in first cavity 5 is adjusted, or first cavity 5 is flooded with the desired gas and the desired internal pressure via the access channel. Furthermore, for example, in a third method step 103, access opening 11 is sealed by introducing energy or heat with the aid of a laser into an absorbing part of substrate 3 or cap 7. Alternatively, for example, it is also provided that in third method step 103, the area around the access channel is preferably heated only locally by a laser, and the access channel is hermetically sealed. Thus, it is advantageously possible to also provide the method according to the present invention with energy sources other than with a laser for sealing access opening 11. FIG. 2 shows micromechanical component 1 after third method step 103 by way of example.

Chronologically after third method step 103, it is possible for mechanical stresses to occur in a lateral area 15, shown by way of example in FIG. 2, on a surface facing away from cavity 5 of cap 7 and in the depth perpendicularly to a projection of lateral area 15 onto the surface, i.e., along access opening 11 and in the direction of first cavity 5 of micromechanical component 1. These mechanical stresses, in particular local mechanical stresses, prevail in particular on and in the vicinity of an interface between a material area 13 of cap 7, which in third method step 103 transitions into a liquid aggregate state and after third method step 103 transitions into a solid aggregate state and seals access opening 11, and a remaining area of cap 7, which remains in a solid aggregate state during third method step 103. In FIG. 2, material area 13 of cap 7 sealing access opening 11 is to be regarded only schematically or is shown only schematically, in particular with respect to its lateral extension or form, extending in particular in parallel to the surface, and in particular with respect to its expansion or configuration perpendicularly to the lateral extension, running, in particular, perpendicularly to the surface.

In FIG. 3, a fourth method step 104, for example, is shown, in fourth method step 104, a recess 1501, which is essentially situated between first cavity 5 and the second cavity, being formed for diverting at least one first particle type A of the first gas mixture and/or at least one second particle type B of the second gas mixture. In other words, a channel or hollow space is produced in fourth method step 104 between two MEMS cavities. In this case, it is provided, for example, that recess 1501 is formed at least partially in a bond layer 1503 situated between substrate 3 and cap 7. Moreover, it is additionally or alternatively provided, for example, that recess 1501 is formed at least partially in a layer 1505 situated between substrate 3 and cap 7. In addition, it is also or alternatively provided that recess 1501 is formed at least partially in an additional layer 1507 situated between substrate 3 and cap 7. Finally, it is additionally or alternatively provided, for example, that recess 1501 is formed at least partially in substrate 3 and/or in cap 7.

For example, it is provided that in a fifth method step, recess 1501 is filled with a filler material. In other words, it is provided, for example, that recess 1501 includes a filler material. In this case, it is provided, for example, that the filler material is open to diffusion for the first particle type A and/or of the second particle type B. In other words, it is provided, for example, that if the channel or recess 1501 is filled in, the channel or the recess is open to diffusion for light gases toward the outside or toward surroundings 9. For example, it is provided that the filler material includes a plastic casting compound or multiple plastic casting compounds. For example, it is also provided that the filler material includes a synthetic resin, in particular, a casting resin. According to the present invention, however, the use of a filler material open to diffusion with respect to first particle type A and/or second particle type B is provided.

Figure 4:
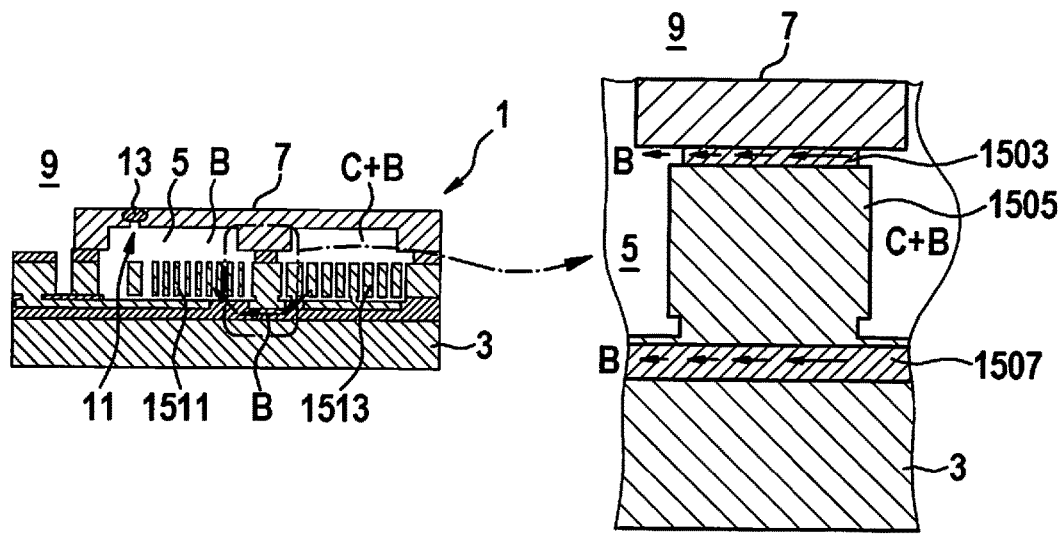
FIG. 4 shows a micromechanical component known from the related art in a schematic representation.

FIG. 4 shows a micromechanical component 1 from the related art in a schematic representation. In this case, substrate 3, first cavity 5, cap 7, sealed access opening 11, solidified material area 13 and surroundings 9 are shown by way of example. Micromechanical component 1 shown by way of example in FIG. 4 includes a first sensor unit 1511 situated in first cavity 5 and a second sensor unit 1513 situated in the second cavity. Moreover, FIG. 4 shows by way of example a second particle type B situated in the second cavity, a second particle type B diffusing from the second cavity in the direction of first cavity 3 and a second particle type B already diffusing into first cavity 5 and situated in the first cavity. A third particle type C is also situated in FIG. 4, which does not diffuse in the direction of first cavity 5.

The enlarged representation in FIG. 4 shows substrate 3 and cap 7. Moreover, FIG. 4 shows by way of example a bond layer 1503, a layer 1505 and an additional layer 1507, bond layer 1503, layer 1505 and additional layer 1507 being situated between substrate 3 and cap 7 and essentially between first cavity 5 and the second cavity.

Figure 5:
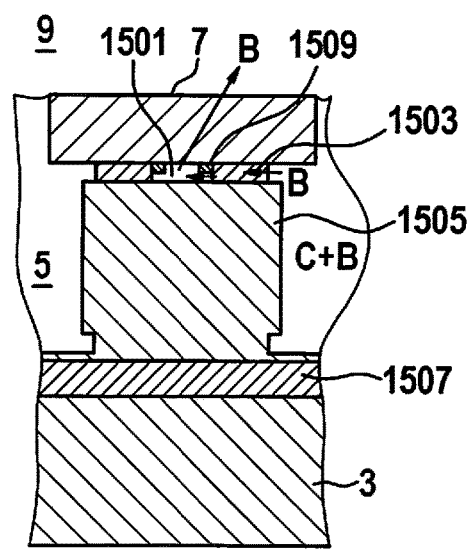
FIG. 5, FIG. 6 and FIG. 7 show details of micromechanical components according to exemplary specific embodiments according to the present invention in schematic representations.
Figure 6:
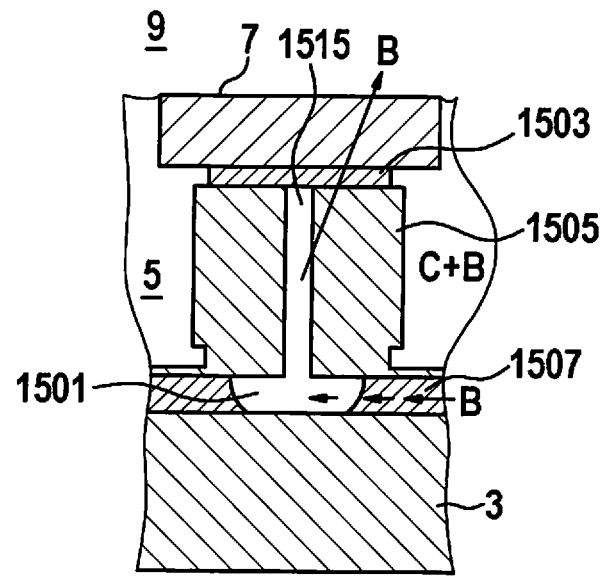
Figure 7:
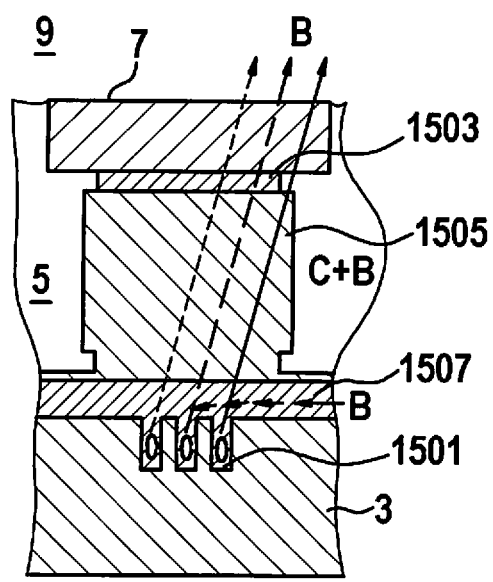

In addition, details of micromechanical components according to exemplary specific embodiments according to the present invention are shown in FIG. 5, FIG. 6 and FIG. 7 in schematic representations. In this case, it is shown by way of example in FIG. 5, FIG. 6 and FIG. 7 that micromechanical component 1 includes a recess 1501 situated essentially between first cavity 5 and the second cavity for diverting at least one first particle type A of the first gas mixture and/or at least one second particle type B of the second gas mixture.

FIG. 5 in this case shows by way of example, that recess 1501 is situated at least partially in a bond layer 1503 situated between substrate 3 and cap 7. FIG. 5 shows by way of example a cap 7 or cap wafer, which protects the MEMS structure or a first sensor unit 1511 and a second sensor unit 1513. In a sixth method step, for example, cap 7 or the cap wafer is applied to substrate 3 with a seal glass or with an eutectic bond connection such as, for example, an aluminum-germanium (AlGe) alloy or a copper-tin (CuSn) alloy or with a direct bonding method such as gold-gold (AuAu). For example, it is provided in this case that recess 1503 is formed as a slit-shaped break in the bond connection, which separates first cavity 5 from the second cavity or an accelerator sensor from a rotation rate sensor, and extends at least on one side to the chip edge or is connected essentially perpendicularly to the image plane of FIG. 5 at least on one side of micromechanical component 1 with surroundings 9 or is opened in another manner or is connected to surroundings 9. This may occur, for example, in that with the release of the contact surfaces, in particular of a first surface of cap 7 and a second surface of layer 1505, the channel or recess 1501 is also released. This therefore advantageously enables the channel or recess 1501 to be formable very early in the process prior to separation of the chips.

For example, it is provided according to the present invention that a stop structure 1509 is situated between substrate 3 and cap 7 and essentially between first cavity 5 and the [second cavity]. Alternatively, it is also provided, for example, that two or three or four or five or six or more than six stop structures 1509 are situated between substrate 3 and cap 7 and essentially between first cavity 5 and [the second cavity]. It is provided, for example, that stop structure 1509 or stop structures 1509 are situated on substrate 3 and/or on cap 7 or are touching substrate 3 and/or cap 7. This is shown by way of example in FIG. 5. Such a stop structure 1509 is advantageous, for example, for bond connections, which become liquid or smear or are squeezed, where such a reliably opened channel or reliably opened recess 1501 is implementable. Moreover, a particularly narrow recess 1501 is implementable with the aid of one or multiple stop structures 1509.

In addition, it is alternatively or additionally also provided, for example, that recess 1501 is formed at least partially in layer 1505. In this case, it is provided, for example, that in order to reach a channel or recess 1501 in the bond connection, a trench is etched into the uppermost MEMS layer or layer 1505 on the sensor wafer. In this case, it is provided, in particular, that recess 1501 is formed in such a way that the bond material does not reach into recess 1501 or does not seal the recess. In other words, the slit or recess 1501 is selected small enough so that the bond material does not penetrate into the slit.

Furthermore, it is also provided, for example, that an indentation is applied or formed below layer 1505 or under the MEMS layer on a side of layer 1505 facing substrate 3. For example, it is provided that the indentation in this case is formed, for example, in substrate 3 or in additional layer 1507. The indentation in this case is formed, for example, with the aid of an etching step. Moreover, it is provided, for example that the indentation is formed chronologically before a deposition or a growing of layer 1505. This therefore advantageously enables the indentation to be reproduced as topography over the MEMS layer or over layer 1505 upwardly or in the direction of cap 7, and thus a recess 1501 is formed on a side of layer 1505 facing cap 7. In this case, it is provided, for example, that a bonding method is applied, the bond material used in the bonding method being unable to compensate for the topography, so that recess 1501 retains its form chronologically even after the bonding process.

It is provided, for example, that the MEMS functional layer or layer 1505 is bonded to substrate 3. In this case, it is provided, for example, that a direct bonding method is carried out. For example, it is provided that layer 1505 is bonded to substrate 3 chronologically before the cap wafer or cap 7 is applied to layer 1505. In this case, it is provided, for example, that recess 1501 or the channel is applied or situated below the functional layer or below layer 1505. In this case, it is provided, for example, that the recess is formed in layer 1505. In other words, a trench is provided in the substrate, for example, and/or a trench is etched into the underside of the MEMS functional layer or in a side of layer 1505 facing substrate 3. For example, it is also provided that the trench in substrate 3, in particular during a direct bonding, is a minimal topographical difference. Finally, it is also provided, for example, that, in particular during a direct bonding, the pre-conditioning of at least one of the two bonding partners, in particular, of at least the layer or substrate 3, is disrupted locally in a strip between first cavity 5 and the second cavity or between the acceleration sensor cavity and rotation rate sensor cavity, in order in this way to produce a strip with no connection, which may also act as a channel or performs the function of recess 1501 or is formed as recess 1501.

Moreover, FIG. 6 shows by way of example that recess 1501 is situated at least partially in a layer 1505, which is situated between substrate 3 and cap 7. Furthermore, FIG. 6 also shows by way of example that recess 1501 is situated at least partially in an additional layer 1507, which is situated between substrate 3 and cap 7. In this case, it is provided, for example, that recess 1501 is formed with the aid of access holes 1515 in layer 1505 and an isotropic etching step. In other words, a channel or a recess 1501 is produced below the uppermost MEMS functional layer or on a side of layer 1505 facing substrate 3. In this case, it is provided, for example, that chronologically a series or a plurality of access holes 1515 is first produced in the uppermost MEMS layer or in layer 1515 and chronologically thereafter the underlying layer or additional layer 1507, layer 1507 including an oxide layer, for example, is etched using an isotropic etching step, for example, a hydrogen fluoride (HF) gas phase etching, until a continuous channel or recess 1501 is present in the material underlying the MEMS layer or in additional layer 1507. It is provided, for example, that the micromechanical component includes a series or a plurality of access holes 1515. This advantageously makes it possible for the mechanical stability of the MEMS layer or layer 1505 to be only minimally impaired, or for the layer to exhibit a mechanical stability sufficient for the functionality of micromechanical component 1. Alternatively, it is also provided, for example, that a continuous channel extending, in particular, continuously essentially perpendicularly to the image plane in FIG. 6 is produced in the MEMS layer. This is advantageous, in particular, if a particularly lightweight and material-saving design is desired and the mechanical stability is sufficient for the functionality of micromechanical component 1 in spite of the continuously extending channel. Thus, it is advantageously made possible for standard manufacturing steps of the MEMS process to be used in the method according to the present invention for forming the channel or recess 1501.

Finally, FIG. 7 shows by way of example that recess 1501 is situated at least partially in substrate 3. Moreover, it is alternatively or additionally also provided, for example, that recess 1501 is situated at least partially in cap 7. In addition, it is alternatively or additionally also provided that recess 1501 is situated at least partially in a strip conductor buried in substrate 3. Furthermore, it is also provided, for example, that recess 1501 is situated at least partially in a third layer.

Furthermore, it is also provided according to the present invention that a narrow trench is etched in substrate 3 or in a strip conductor buried in substrate 3 or in additional layer 1507 or in a strip conductor buried in additional layer 1507 or in a third layer or in a strip conductor buried in the third layer, in such a way that in a deposition method step or growing method step following the etching step, the trench grows shut, but a hollow space or recess 1501 forms due to the profile of the trench. According to the present invention, it is also provided, for example, that such a recess 1501 is produced or formed with the aid of multiple combined etching processes and deposition processes.

According to the present invention, it is also provided, for example, that in the fourth method step additional, in particular, one additional or two additional or three additional or four additional or five additional or six additional or more than six additional recesses 1501 situated essentially between first cavity 5 and the second cavity are formed for diverting at least one particle type A of the first gas mixture and/or at least one second particle type B of the second gas mixture. Three recesses 1501 are shown by way of example in FIG. 7. For example, it is also provided that recesses 1501 shown by way of example in FIG. 5, FIG. 6 and FIG. 7 are arbitrarily combinable with one another.

It is provided, for example, that second particle type B includes molecular hydrogen (H2). Thus, a method is advantageously provided, with which, for example, the diffusion of H2 from one MEMS cavity or from the second cavity to another MEMS cavity or to first cavity 5 is prevented or reducible compared to the related art. Alternatively or additionally, it is also provided, for example, that second particle type B includes additional light gases. This therefore advantageously makes it possible, for example, for the diffusion of light gases from one MEMS cavity or from the second cavity to another MEMS cavity or to first cavity 5 to be prevented or to be reducible compared to the related art. For example, it is provided that first particle type A is a particle of a first light gas and second particle type B is a particle of a second light gas. For example, it is provided that the first light gas corresponds to the second light gas. Alternatively, it is also provided that the first light gas differs from the second light gas.

In addition, it is provided, for example that micromechanical component 1 includes a second access opening connecting recess 1501 and surroundings 9. For example, it is additionally provided that micromechanical component 1 includes a third access opening connecting recess 1501 and surroundings 9. For example, it is provided that the second access opening and/or the third access opening are formed essentially perpendicularly to the image plane of FIG. 5, FIG. 6 and FIG. 7. In a connection between recess 1501 and surroundings 9, it is advantageous that the partial pressure of light gases such as, for example, H2, He and Ne to air is extremely minimal and that therefore, for example, gas diffusing from the acceleration sensor cavity or from the second cavity into the channel or into recess 1501 is diverted outwardly or in the direction of surroundings 9. The advantageous result of this, therefore, is that the gas does not diffuse further into the rotation rate sensor cavity or into the first cavity.

Finally, it is provided, for example, that in fourth method step 104, one recess each situated essentially between first cavity 5 and the second cavity are formed in multiple micromechanical components 1 of a wafer before a separation of micromechanical components 1 from one another. However, it is also provided, for example, that multiple micromechanical components 1 of a wafer are first separated from one another and subsequently, in fourth method step 104, one recess each situated essentially between first cavity 5 and the second cavity is formed in multiple micromechanical components 1.

What is claimed is:

1. A micromechanical component, comprising:
    a substrate; and
    a cap connected to the substrate, the cap, together with the substrate, enclosing a first cavity, a first pressure prevailing and a first gas mixture having a first chemical composition being enclosed in the first cavity, the cap, together with the substrate enclosing a second cavity, a second pressure prevailing and a second gas mixture having a second chemical composition being enclosed in the second cavity, the substrate or the cap including a sealed access opening;
    wherein the micromechanical component includes a recess situated between the first cavity and the second cavity for diverting at least one of: i) at least one first particle type of the first gas mixture, and ii) at least one second particle type of the second gas mixture,
    wherein the recess is situated at least partially in a bond layer, which is situated between the substrate and the cap, wherein the recess is formed as a slit-shaped break in the bond connection.

2. The micromechanical component as recited in claim 1, wherein the recess is situated at least partially in a layer, which is situated between the substrate and the cap.

3. The micromechanical component as recited in claims 2, wherein the recess is situated at least partially in an additional layer, which is situated between the substrate and the cap.

4. The micromechanical component as recited in claims 1, wherein the recess is situated at least partially in at least one of the substrate and the cap.

* * * * *